(12) United States Patent
Desai et al.

(10) Patent No.: US 11,747,371 B2
(45) Date of Patent: Sep. 5, 2023

(54) SELF-CALIBRATED INPUT VOLTAGE-AGNOSTIC REPLICA-BIASED CURRENT SENSING APPARATUS

(71) Applicant: Intel Corporation, Santa Clara, CA (US)

(72) Inventors: Nachiket Desai, Hillsboro, OR (US); Harish Krishnamurthy, Beaverton, OR (US); Suhwan Kim, Portland, OR (US); Fabrice Paillet, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 17/006,715

(22) Filed: Aug. 28, 2020

(65) Prior Publication Data

US 2022/0065901 A1 Mar. 3, 2022

(51) Int. Cl.
*G01R 19/00* (2006.01)
*H03F 1/34* (2006.01)
*H03F 3/45* (2006.01)
*H02M 3/158* (2006.01)
*G01R 1/30* (2006.01)
*H03F 1/42* (2006.01)
*G05F 3/26* (2006.01)
*H02M 1/00* (2006.01)

(52) U.S. Cl.
CPC .......... *G01R 19/0023* (2013.01); *G01R 1/30* (2013.01); *G05F 3/262* (2013.01); *H02M 3/158* (2013.01); *H03F 1/34* (2013.01); *H03F 1/42* (2013.01); *H03F 3/45748* (2013.01); *H02M 1/0009* (2021.05); *H03F 2203/45084* (2013.01)

(58) Field of Classification Search
CPC ....... G01R 19/0023; G01R 1/30; G05F 3/262; H02M 3/158
See application file for complete search history.

(56) References Cited

U.S. PATENT DOCUMENTS

| | | | | |
|---|---|---|---|---|
| 9,791,480 | B2* | 10/2017 | Qin | G01R 19/0092 |
| 11,029,714 | B2* | 6/2021 | Al-Shyoukh | G05F 3/242 |
| 2003/0164730 | A1* | 9/2003 | Milanesi | H03F 3/45475 330/9 |
| 2009/0167291 | A1* | 7/2009 | Richeson | G01D 4/004 324/107 |

(Continued)

*Primary Examiner* — Dominic E Hawkins
(74) *Attorney, Agent, or Firm* — Schwabe, Williamson & Wyatt, P.C.

(57) ABSTRACT

A current sensing topology uses an amplifier with capacitively coupled inputs in feedback to sense the input offset of the amplifier, which can be compensated for during measurement. The amplifier with capacitively coupled inputs in feedback is used to: operate the amplifier in a region where the input common-mode specifications are relaxed, so that the feedback loop gain and/or bandwidth is higher; operate the sensor from the converter input voltage by employing high-PSRR (power supply rejection ratio) regulators to create a local, clean supply voltage, causing less disruption to the power grid in the switch area; sample the difference between the input voltage and the controller supply, and recreate that between the drain voltages of the power and replica switches; and compensate for power delivery network related (PDN-related) changes in the input voltage during current sensing.

19 Claims, 7 Drawing Sheets

(56) References Cited

U.S. PATENT DOCUMENTS

| | | | |
|---|---|---|---|
| 2010/0156683 A1* | 6/2010 | Nozawa | H03F 3/45183 |
| | | | 341/122 |
| 2012/0235656 A1* | 9/2012 | Otsuka | H02M 3/1588 |
| | | | 323/282 |
| 2015/0042300 A1* | 2/2015 | Peker | H02M 3/156 |
| | | | 323/274 |
| 2019/0081559 A1* | 3/2019 | Seshia | H02N 2/181 |
| 2019/0089179 A1* | 3/2019 | Kamibayashi | H01M 10/441 |
| 2019/0379270 A1* | 12/2019 | Pullen | H02M 3/158 |

* cited by examiner

SELF-CALIBRATED INPUT VOLTAGE-AGNOSTIC REPLICA-BIASED CURRENT SENSING APPARATUS

BACKGROUND

Current sensor accuracy plays a key role in determining system performance across a wide variety of applications. Maintaining a high accuracy across a wide dynamic range at high switching frequencies is very challenging. Furthermore, a classic tradeoff in analog circuit design is the speed vs offset due to variations and the power overheads and this tradeoff is becoming worse as we go across smaller process nodes.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
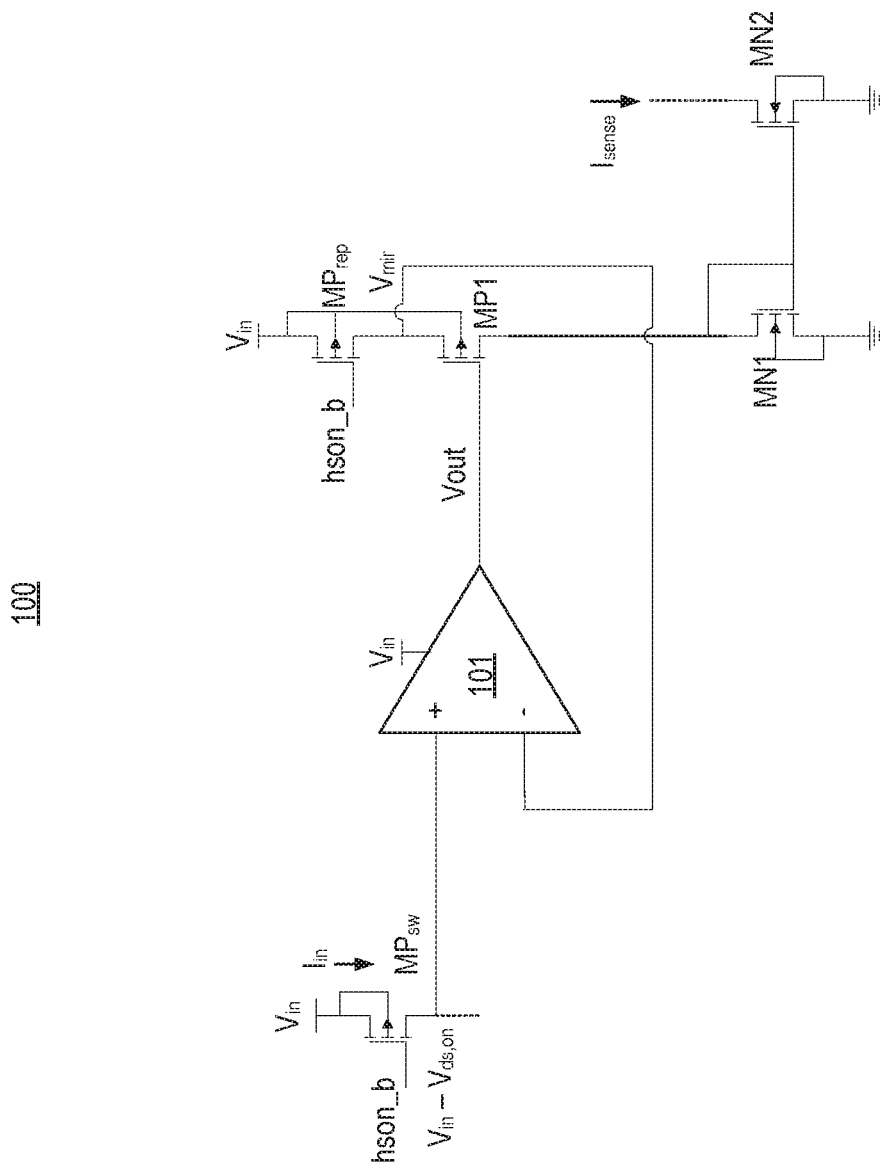
FIG. 1 illustrates a schematic of a basic replica-biased current sensor.

One way of implementing current sensors is by sensing the voltage across the switch and using a calibrated amplifier along with a measured switch resistance profile to infer the current passing through it. Another common technique for sensing the current in a high-side power converter switch is to use a much smaller replica switch biased at the same Vgs (gate-to-source voltage) and Vds (drain-to-source voltage) as the high-side power converter switch and steering the current through the replica switch into a current mirror or a resistor to get a current-mode or voltage-mode output. Matching the Vgs of the power switch whose current is being sensed in the replica switch is relatively simple. A feedback network is generally employed to match the Vds of the replica switch to steer the current through it to the sensor output.

Measuring the Vds to sense current introduces several sources of inaccuracy: amplifier gain errors, switch resistance calibration errors, temperature dependency, etc. For example, a voltage reference needs to be generated during system startup to calibrate the sensor gain. A multi-point calibration might be necessary if there is significant non-linearity in any of the elements in the sensor signal chain. Furthermore, calibration done on one phase of the converter might not be reusable across a system-on-chip (SoC) due to process variation. Temperature variation created by imperfect current balancing across converter phases further exacerbates this problem.

For a typical replica-biased current sensor, the feedback network needs to add negligible error to the generated Vds, which is typically less than 50 mV. This imposes very tight restrictions on the feedback amplifier gain and offset. These requirements need to be met while the sensor is being directly exposed to noise and/or ringing on the input rail, which can be substantial. In addition, buck converter input voltages are typically beyond the reliability limits of thin gate transistors in advanced FinFET process nodes. This necessitates using stacked devices or thick gate devices, both of which add design and/or fabrication complexity and degrade performance.

The sensor can be made to run from a separate, less noisy supply voltage. This makes it challenging to match the drain voltage of the main power switch, whose voltages are referenced to Vin (input power supply coupled to the main power switch), and the replica switch, whose voltages are referenced to the controller supply, across a wide input voltage range. Any change in the input voltage Vin arising from the impedance of a power delivery network (PDN), which provided the input power supply, when the power switch turns on can directly impact the accuracy of the current sensor. In addition, co-locating the sensor and the replica FETs with the power switches for lower parasitics and better replica matching imposes a penalty on the strength of the power grid routing, since resources must be allocated to route the sensor's power supply and shield it from the noise being generated by the power switches.

Some embodiments present a current sensing topology that overcomes a number of significant sources of error, like offset, temperature dependence, bandwidth, etc. that limit the accuracy of existing current sensing solutions for switching power converters. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input supply voltage during current sensing.

In some embodiments, the current sensor comprises: an amplifier having a first input and a second input, and an output; and a switched capacitor circuitry coupled to the first input and the second input. The switched capacitor circuitry senses an input offset of the amplifier, and compensates the input offset during current measurement through a switch (of a DC-DC converter). In some embodiments, the current sensor comprises a first device which is a replica of the switch. In some embodiments, a DC level-shifter is coupled in series with the first device. In some embodiments, the current sensor comprises a second device coupled in series with the DC level-shifter and controllable by the output of the amplifier. The sensed current is measured by a current mirror coupled to the second device.

In some embodiments, the current mirror is operable to be turned off when the input offset of the amplifier is being sensed. In some embodiments, a common mode voltage Vcm is coupled to the first input when the input offset of the amplifier is being sensed. In some embodiments, the output of the amplifier is coupled to the second input when the input offset of the amplifier is being sensed. In some embodiments, the first device is smaller than the switch. For example, the first device is 100 times smaller than the switch. In some embodiments, the switch is a power switch of a DC-DC converter (e.g., buck converter, low dropout LDO, boost converter, buck-boost converter, etc). In some embodiments, the switch is coupled to an input power supply node Vin, wherein the input power supply node is coupled to a capacitor of the switched capacitor circuitry when the input offset of the amplifier is being sensed, and wherein the capacitor is coupled to the second input of the amplifier.

In some embodiments, the amplifier is powered by a power supply node Vcc different from the input power supply node, wherein the power supply node provides a voltage lower than a voltage provided by the input power supply node. In some embodiments, the first device (replica device) is coupled to the capacitor when current is being sensed through the switch. In some embodiments, the DC level-shifter includes one of: diode-connected transistor or a transistor with a gate which is biased. In some embodiments, a loop gain of the amplifier is lower when current is being sensed through the switch than a loop gain during calibration of the input offset of the amplifier. In some embodiments, a Miller capacitance of the amplifier is increased during calibration of the input offset of the amplifier. In some embodiments, the Miller capacitance of the amplifier is reduced when current is being sensed through the switch.

There are many technical effects of the various embodiments. For example, the current sensing apparatus provides highly accurate current sensing in power converters with far fewer trims and settings than are needed in current systems. Unlike approaches that require a calibrated amplifier, the approach of various embodiments relies on the ratio between the sizes of the power switch and a matched replica distributed among the power switches, making it more robust. The ability to operate agnostic to the input voltage also allows the same sensor to be used in a wide variety of applications with different input voltages without the need for significant redesign. The performance of the current sensor is also independent of the input voltage, by using capacitively coupled inputs and biasing strategies that operate circuits in regions of optimal performance. This is in contrast with conventional replica-biased circuits, that need to be carefully designed to operate at a given range of input voltages. Accurate current sensing across a large number of applications allows for better metering in energy-constrained applications. In cases where current consumption needs to be throttled due to electrical and/or thermal limits, an accurate current sensor can reduce the guard band and allow the system to operate at maximum performance Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g , immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a schematic of a basic replica-biased current sensor 100. Sensor 100 consists of amplifier 101 coupled to a high-side switch MPsw, replica high-side switch MPrep, p-type transistor MP1, and current mirror MN1 and MN2 coupled as shown. High-side switch MPsw is controlled by hson_b. Replica-biased current sensing is a common way to sense the current passing through a power switch MPsw by replicating its Vgs and Vds across a matched device that is much smaller than the switch MPsw. The aim of the feedback loop (from Vout, to Vmir to amplifier 101) is to equalize the Vds across the power switch Msw and the replica Mrep.

However, sensor 100 needs the controller or amplifier supply voltage Vcc to be the same as the power converter's input voltage Vin. Depending on the particular converter topology and the application it is being used for, this might not be practical, and might expose sensor 100 to the input voltage, which can often be noisy. In addition, efficient power converters have low conduction loss, which means the Vds,on of the power switch MPsw is low. With current sensor 100, amplifier 101 would need to have an input common mode range that covers its supply rail while maintaining high gain, high bandwidth and low offset, which can potentially compromise its performance These challenges are handled by the sensor of FIG. 2.

Figure 2:
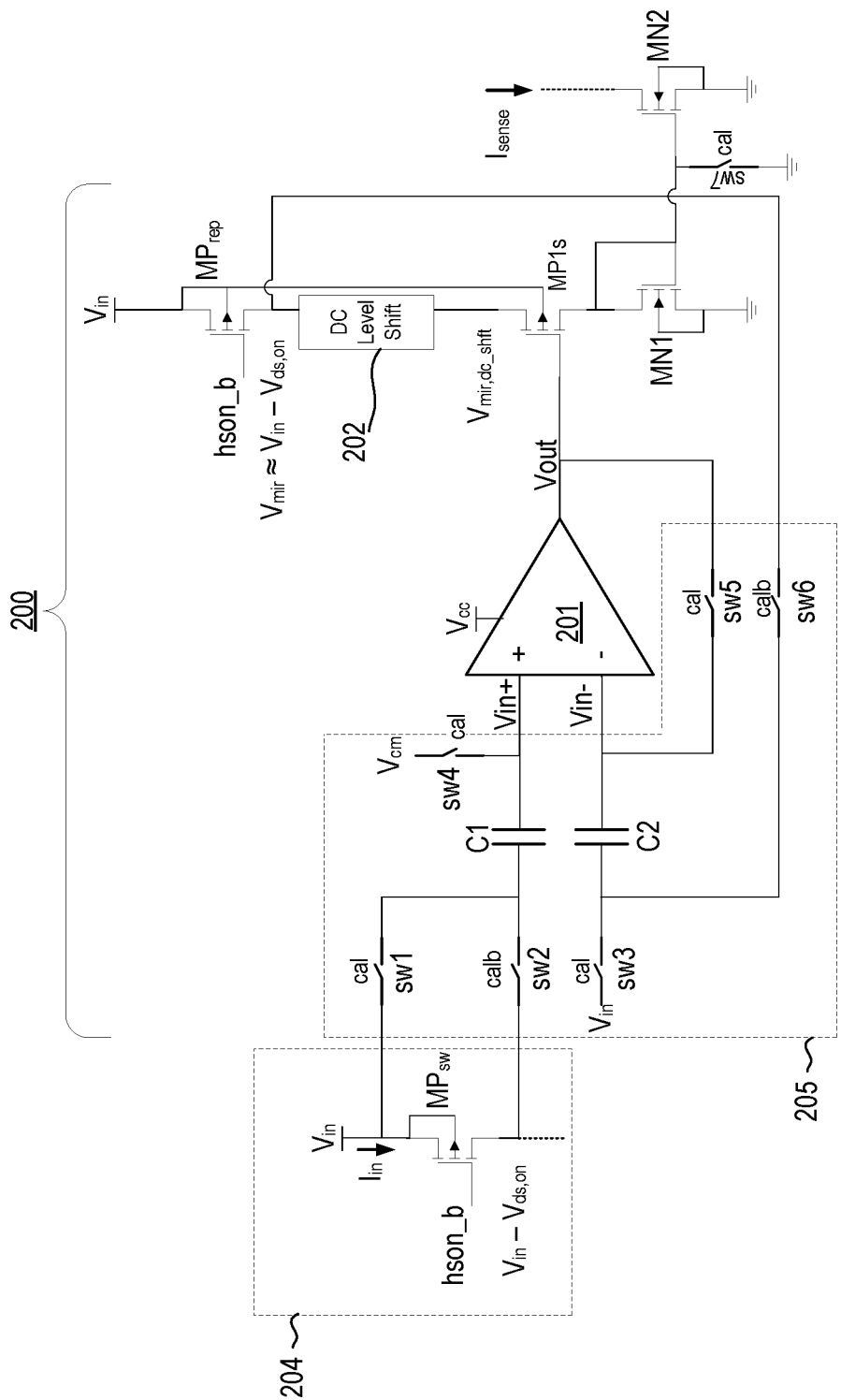
FIG. 2 illustrates a schematic of a capacitively sampled replica-biased current sensor, in accordance with some embodiments.

FIG. 2 illustrates a schematic of a capacitively sampled replica-biased current sensor 200, in accordance with some embodiments. Sensor 200 comprises amplifier 201, switches sw1, sw2, sw3, sw4, sw5, sw6, and sw7, capacitors C1 and C2, replica power switch MPrep, p-type transistor MP1s, current mirror MN1 and MN2, and DC level-shifter 202 coupled as shown. Switches sw1, sw3, sw4, sw5, and sw7 are controlled by calibration signal "cal". Switches sw2 and sw6 are controlled by an inverse of the calibration signal, i.e., calb. Capacitors C1 and C2 can be implemented as transistors, discrete devices, metal capacitors, metal insulator metal (MIM) capacitors, ferroelectric capacitors, or a combination of them. Switches sw1, sw2, sw3, sw4, sw5, sw6, and sw7 can be implemented as n-type device(s), p-type device(s), or a combination of them. A switched capacitor circuitry 205 is shown.

Sensor 200 addresses some of these problems with the basic replica-biased current sensor 100 shown in FIG. 1. In some embodiments, sensor 200 runs a calibration loop to sample the offset of the amplifier at regular intervals. In a switched power converter, this can be accomplished when the switch (MPsw, in a voltage converter 204), through which current needs to be measured, is off. During calibration (when cal turns on the switches), the inputs of amplifier 201 are biased to a common-mode voltage Vcm that is closer to the middle of the amplifier's input common mode range. The input offset of amplifier 201 is also sampled onto the capacitors, whose other terminals are held at a fixed voltage (Vin).

The drain node of the power switch MPsw is the input to the current sensor and is capacitively sampled during measurement. Due to the capacitive sampling, amplifier 201 in the feedback loop tries to equalize the change in the voltage on both of its inputs. This in turn ensures that the mirror node voltage Vmir follows the drain of the power switch MPsw, and the current in the replica transistor MPrep follows the waveform of the current through the power switch times the ratio of the W/L of the two transistors.

In most cases, the supply voltage of amplifier 201 is lower than the input voltage of the converter. In order for the current sense feedback loop to work, a DC level-shifter 202 is used that shifts the mirror node voltage Vmir to a voltage level that keeps amplifier 201 in a linear region of operation. DC level-shifter 202 ideally acts as a short circuit for the AC component of Vmir. An appropriate number of forward biased diodes can be used to shift the DC level of Vmir down. Alternatively, an appropriately biased common gate transistor can be used to implement the DC shift.

While the various embodiments are illustrated for sensing current through a p-type power switch MPsw, the power switch can be n-type or a combination of p-type and n-type transistors. In various embodiments, the replica transistor MPrep follows the same conductivity type and transistor configuration as that of the power switch MPsw. While the embodiments are described with reference to current sensing of a power switch, the embodiments are not limited to such. The current sensor of various embodiments can sense and/or measure current through any device whose current is desired to be measured.

Figure 3:
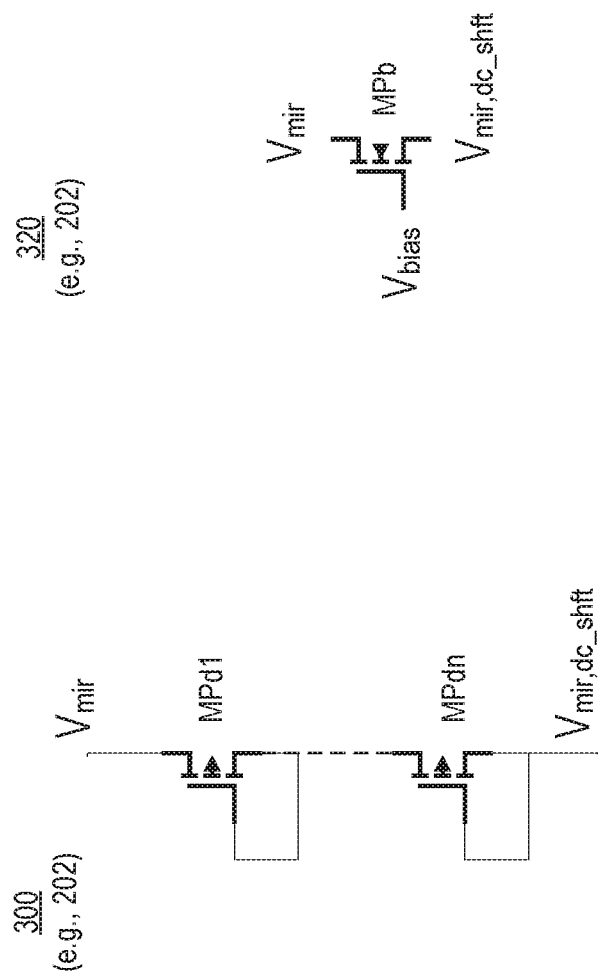
FIGS. 3A-B illustrate DC level-shifters, respectively, for the current sensor of FIG. 2, in accordance with some embodiments.

FIGS. 3A-B illustrate DC level-shifters 300 and 320, respectively, for the current sensor of FIG. 2, in accordance with some embodiments. DC level-shifter 300 comprises diode-connected transistors coupled in series such as transistors MPd1 through MPdn coupled between node Vmir and Vmir,dc_shift. DC level-shifter 320 comprises transistor MPb biased by Vbias, wherein transistor MPb is coupled to Vmir and Vmir,dc_shift. Vbias can be generated by any suitable source such as a voltage divider, resistor divider, a bandgap circuit, etc.

Sensor 200 works efficiently with a clean analog supply for Op-Amp 201 (operational amplifier). Routing this analog supply can be disruptive to the power routing if the replica FET MPrep and the associated sensing circuitry are co-located with the power FETs MPsw. This can be avoided by using the power converter input supply Vin to create a local, clean, regulated supply Vcc with high PSRR (power supply rejection ratio). In an example, with the converter input being around 1.8 V and the Op-Amp supply rail created being around 0.8-1V, a linear regulator with an analog control loop can generate this with high PSRR using a source follower output stage.

In some embodiments, amplifier 201 can be a 2-stage Op-Amp with a high open loop DC gain and dominant pole compensation. In some cases, the loop gain during measurement is significantly lower than the loop gain during calibration. This is because during measurement, the output branch with MPrep acts as a source follower with a very small load resistance since MPrep is fully on. This causes the loop gain to degrade by as much as 30 dB from calibration to measurement. A dominant pole compensation network designed to ensure adequate phase margin during calibration can lead to extremely low DC loop gain during measurement, which would lead to a large error in Vmir and the sensed current.

Figure 4:
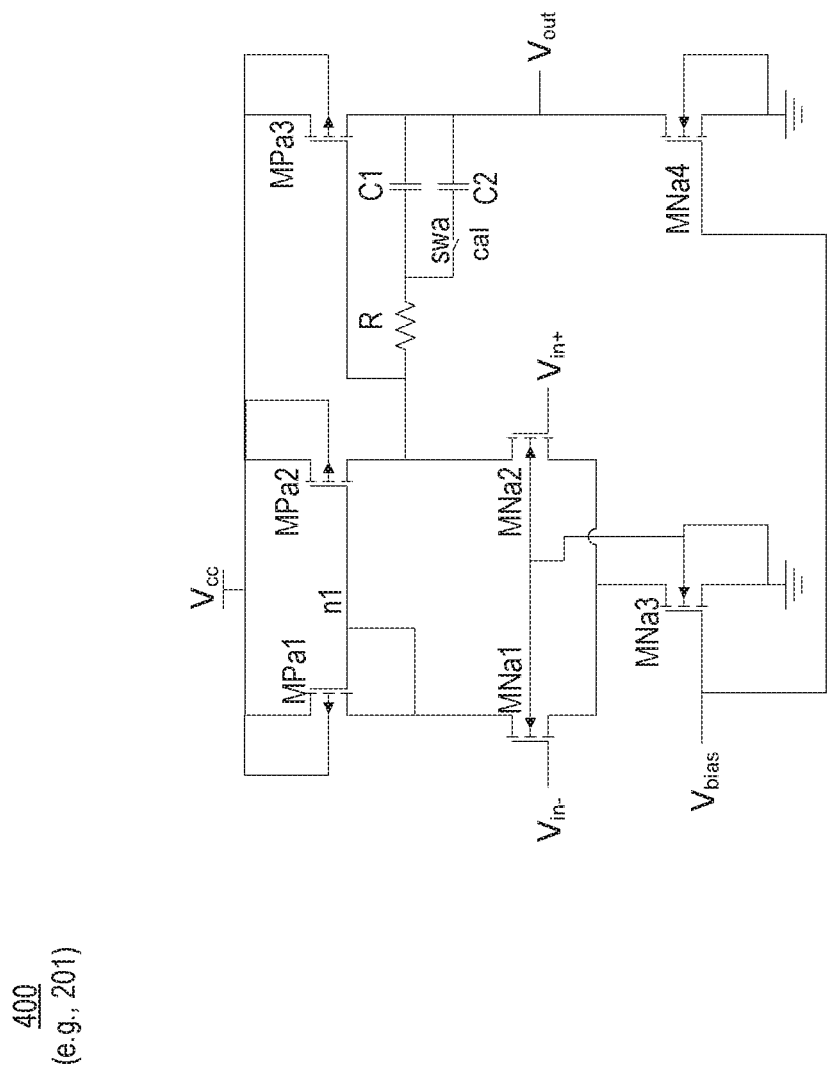
FIG. 4 illustrates a 2-input operational amplifier (Op-Amp) with dynamically adjusted compensation for use in the sensor of FIG. 2, in accordance with some embodiments.

FIG. 4 illustrates a 2-input operational amplifier (Op-Amp) 400 with dynamically adjusted compensation for use in the sensor of FIG. 2, in accordance with some embodiments. Op-Amp 400 comprises p-type transistors MPa1, Mpa2, and MPa3, n-type transistors MNa1, MNa2, MNa3, and MNa4, compensation capacitors C1 and C2, and compensation resistor R coupled as shown. Transistor MPa1 is diode-connected and coupled to MPa2 via node n1. Transistor MNa3 is a current source biased by Vbias. Vbias can be generated by any suitable source. Inputs Vin+ and Vin− are received by MNa2 and MNa1, respectively. The output is Vout. Op-Amp 400 addresses issues discussed above by temporarily increasing the Miller capacitance used in the dominant pole compensation network during calibration. This ensures both adequate phase margin while calibrating the sensor as well as sufficient loop gain during measurement.

Figure 5:
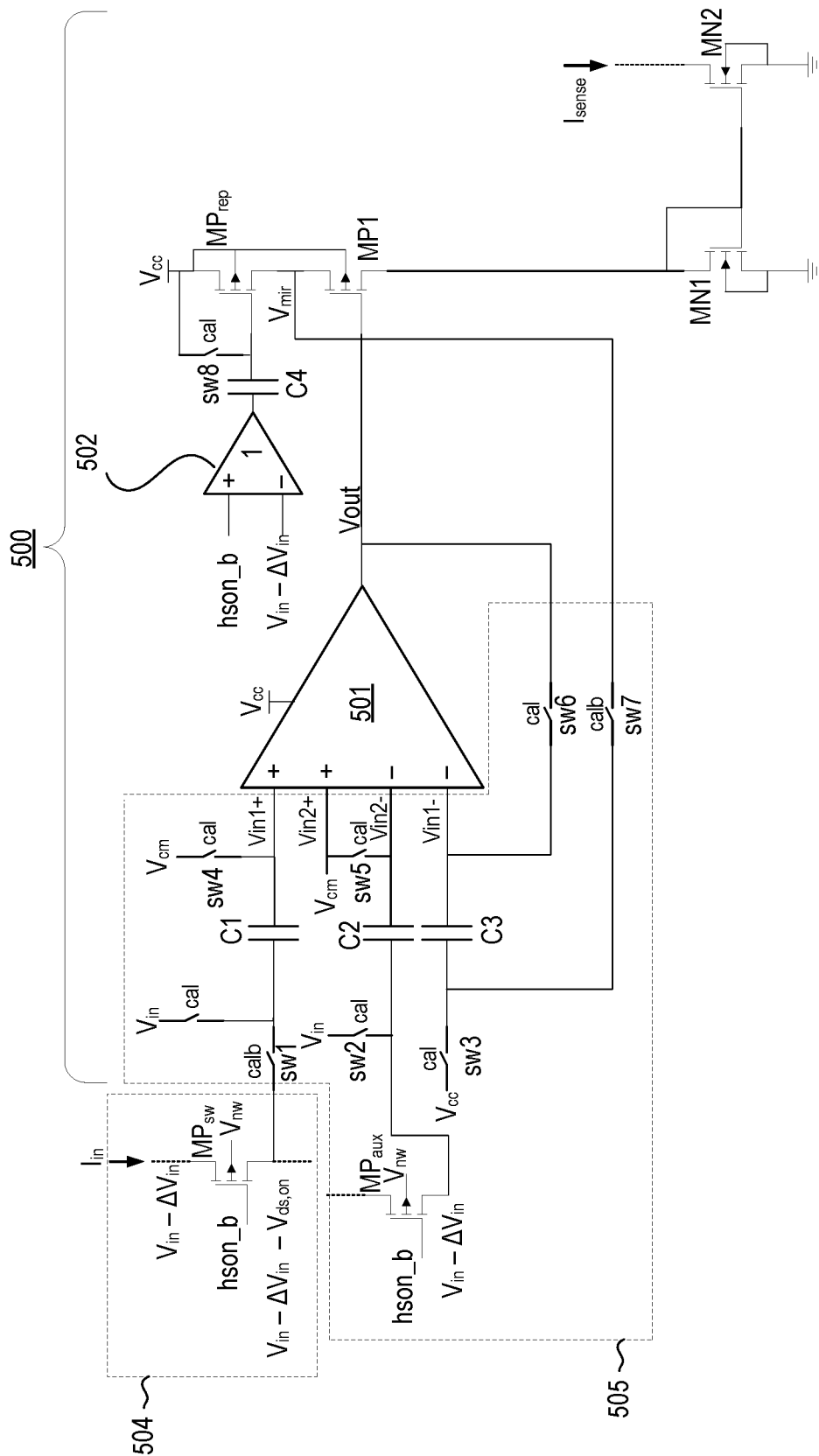
FIG. 5 illustrates a schematic of a capacitively sampled replica-biased current sensor with a 4-input amplifier, in accordance with some embodiments.

FIG. 5 illustrates a schematic of a capacitively sampled replica-biased current sensor 500 with a 4-input amplifier, in accordance with some embodiments. Sensor 500 comprises amplifier 501 (which is a 4-input difference amplifier), switches sw1, sw2, sw3, sw4, sw5, sw6, sw7, and sw8, auxiliary power switch MPaux, unity gain buffer 502, replica power switch MPrep, p-type transistor MP1, current mirror MN1 and MN2, capacitors C1, C2, C3, and C4 coupled as shown. The inputs of amplifier 501 are Vin1+, Vin2+, Vin1−, and Vin2−. The output of amplifier 501 is Vout. A switched capacitor circuitry 505 is shown.

The feedback loop in FIG. 2 can be modified such that the output branch runs off the amplifier supply Vcc. This works if the mirror node is calibrated to Vcc and when the current sensor starts its measurement phase, the drop in the drain voltage across the power switch and the replica switch are equal. This would make the Vds,on of both devices the same and, as long as the Vgs,on is the same, the currents in the power and replica switches will be related directly by the ratio of their W/L ratios.

Sensor 500 demonstrates a replica-biased current sensor with the output branch running off the controller supply Vcc. One challenge with this sensor is that due to the non-zero impedance of the PDN of the input voltage Vin, the drop at one input of the amplifier 501 is a sum of the voltage drop in the PDN ($\Delta V_{in}$) and the Vds,on of the power switch. The replica switch MPrep, which runs off Vcc, does not see the same PDN drop. This leads to the Vds of the replica switch following a voltage larger than just the Vds,on of the power switch, and consequently an over-estimation of the current.

The solution to the problem of over-estimating the current due to the voltage drop in a PDN sensor is to use a 4-input differential difference amplifier 501 instead of a 2-input differential amplifier 201. 4-input amplifier 501 produces an output voltage that is an amplified version of the difference of the sum of the positive inputs and the sum of the negative inputs. During calibration, two of the sampling capacitors C1 and C2 are connected with one end biased at Vin and the other end biased at Vcm. The third sampling capacitor C3 has one end biased at Vcc and the other end (which is also one of the negative inputs) sampling the offset of amplifier 501 in a unity-gain feedback configuration. One of the positive inputs is always connected to Vcm and sees no change in voltage during operation. The calibration operation is best performed when the power switch MPsw (in a voltage regulator 504) is off and conducting no current.

During measurement, one positive input is capacitively connected to the drain of the power switch, and sees a drop of $\Delta Vin+Vds,on$. One of the negative inputs is capacitively connected to a small auxiliary power switch, which is operated synchronously with the main power switch MPsw. The auxiliary switch MPaux is connected such that it carries no load current. Instead, it serves to sample the drop in the input voltage due to the PDN impedance, $\Delta Vin$. Due to the feedback loop, this results in the mirror node dropping by Vds,on, since the sum of the voltage drops at the positive inputs must equal the sum of the voltage drops at the negative inputs.

To measure the current accurately, the Vgs of the power switch MPsw and the replica switch MPrep also needs to be equalized. In sensor 200, this was achieved by tying both transistors' source and gate terminals in the same manner. In Op-Amp 400, this may not be possible since the replica switch has its source connected to Vcc. To equalize the Vgs, the gate of MPrep is initialized to Vcc first during calibration. Then, in the measurement phase, the increase in |Vgs| across MPsw is replicated by capacitively coupling the difference of the gate and source nodes of MPsw on the gate of MPrep. 4-input amplifier 501 can be constructed by re-purposing a standard 2-input differential pair as shown in FIG. 6.

Figure 6:
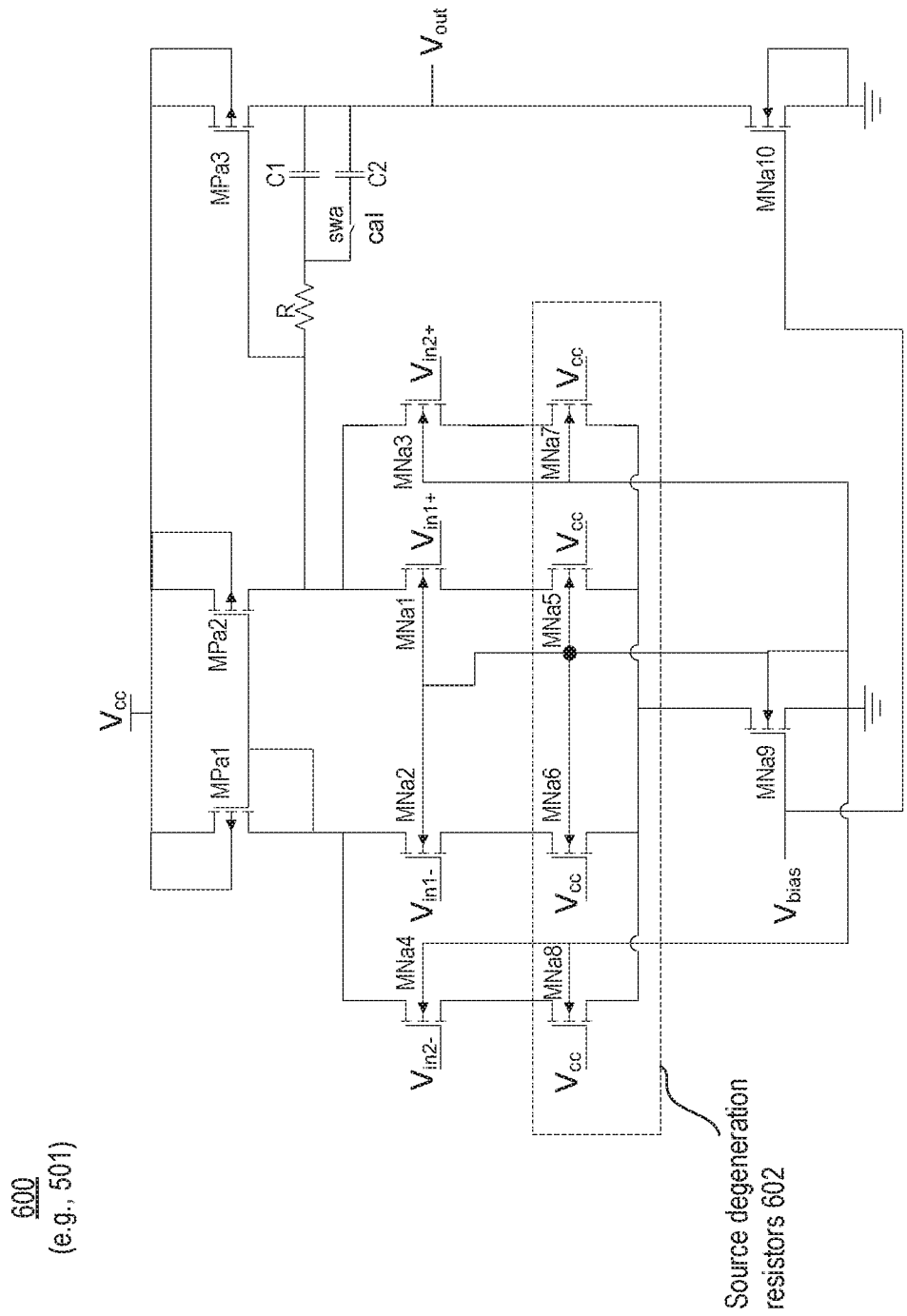
FIG. 6 illustrates a 4-input Op-Amp with dynamically adjusted compensation and source degeneration for linear $g_m$ for use in the sensor of FIG. 5, in accordance with some embodiments.

FIG. 6 illustrates 4-input Op-Amp 600 with dynamically adjusted compensation and source degeneration for linear $g_m$ for use in the sensor of FIG. 5, in accordance with some embodiments. 4-input Op-Amp 600 comprises p-type transistors MPa1, MPa2, and MPa3, n-type transistors MNa1, MNa2, MNa3, MNa4, MNa5, MNa6, MNa7, MNa8, MNa9, and MNa10, compensation capacitors C1 and C2, compensation resistor R, and switch swa coupled as shown. Transistors MNa5, MNa6, MNa7, and MNa8 form a source generation resistor. Transistor MNa9 is a current source biased by Vbias.

All 4 voltage inputs (Vin1+, Vin2+, Vin1− and Vin2−) of the amplifier are converted to currents using matched transistors. These currents are then added and a standard current mirror load is used to convert the output to a single-ended voltage. This can then be amplified further using a $2^{nd}$ amplifier stage. 4-input amplifier 600 can include the same compensation network with the same benefits as the one Op-Amp 400.

The amplifier 600 may rely heavily on the linearity of the transconductance gm of the 4 input transistors. This is because the feedback loop needs to ensure that the sum of the positive input voltages equals the sum of the negative input voltages. Amplifier 600 when connected in the feedback loop as shown in sensor 500 equalizes the sum of the positive input branch currents and the sum of the negative input branch currents. Hence, the use for a linear $g_m$. To ensure this, source degeneration 602 can be used on all inputs of the transistor. This can be implemented either using resistors, or in area-sensitive designs, by a set of matched transistors, all biased in the linear region. While this may degrade the open loop gain of the amplifier, and thus the current sensor, the improvement in performance due to a linear transconductance overall improves the performance of the current sensor.

Amplifier 400 may not rely as much on the linearity of the input transistors' $g_m$ since the feedback loop merely desires to keep the positive and negative inputs almost equal to each other. As long as the input transistors are fairly well-matched, this may not necessarily use high $g_m$-linearity and hence, source degeneration may be unnecessary.

Figure 7:
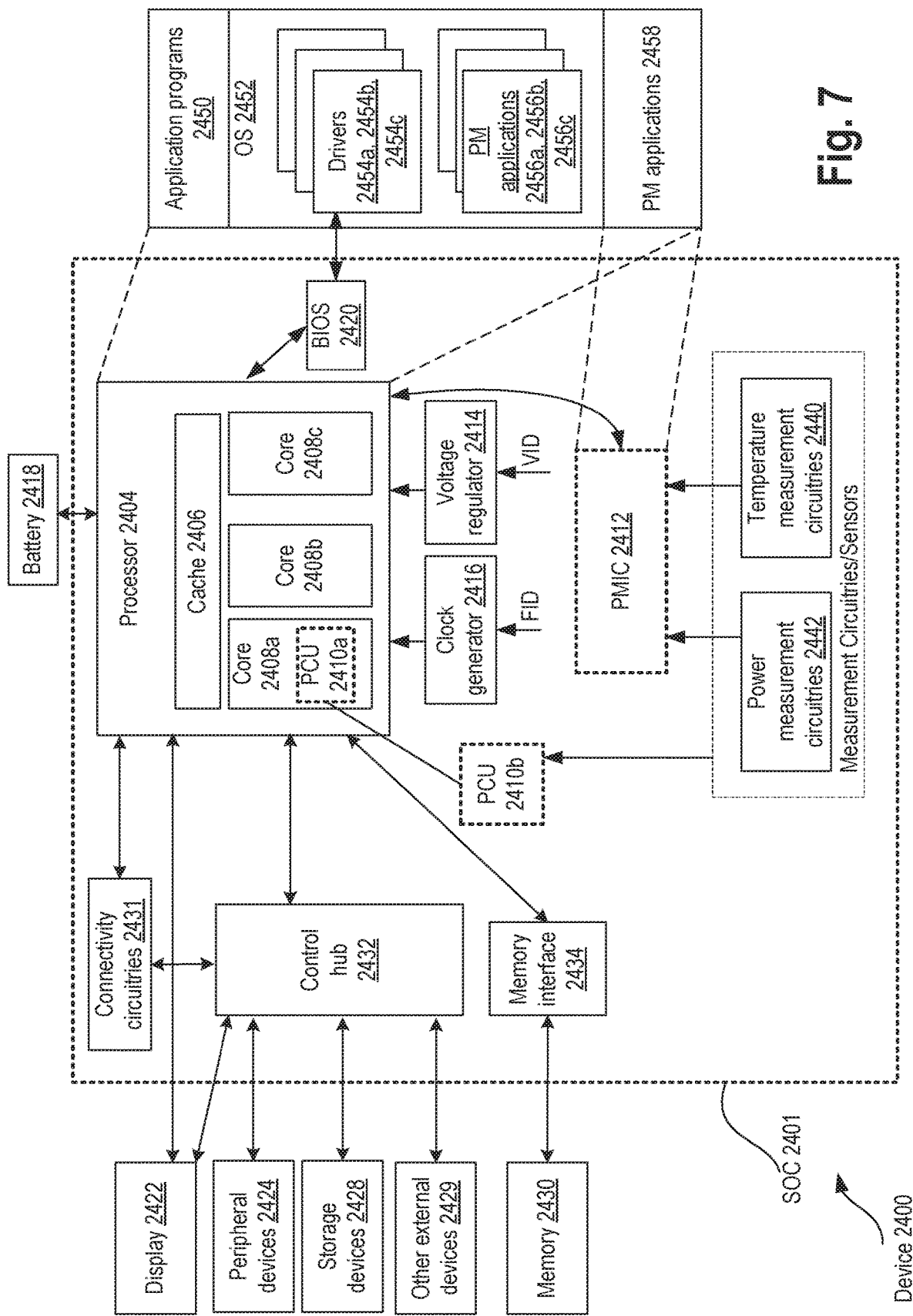
FIG. 7 illustrates a smart device or a computer system or a SoC (System-on-Chip) with capacitively sampled replica-biased current sensor, in accordance with some embodiments.

FIG. 7 illustrates a smart device or a computer system or a SoC (System-on-Chip) with capacitively sampled replica-biased current sensor, in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 7, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labeled PCU 2410a. In an example, some other sections of PCU 2410 may be implemented outside the processing cores 2408, and these sections of PCU 2410 are symbolically illustrated using a dotted box and labeled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SoC 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: an amplifier having a first input and a second input, and an output; a switched capacitor circuitry coupled to the first input and the second input, the switched capacitor circuitry to sense an input offset of the amplifier, and to compensate the input offset during current measurement through a switch; a first device which is a replica of the switch; a DC level-shifter coupled in series with the first device; a second device coupled in series with the DC level-shifter and controllable by the output of the amplifier; and a current mirror coupled to the second device.

Example 2: The apparatus of example 1, wherein the current mirror is operable to be turned off when the input offset of the amplifier is being sensed.

Example 3: The apparatus of example 1, wherein a common mode voltage is coupled to the first input when the input offset of the amplifier is being sensed.

Example 4: The apparatus of example 1, wherein the output of the amplifier is coupled to the second input when the input offset of the amplifier is being sensed.

Example 5: The apparatus of example 1, wherein the first device is smaller than the switch.

Example 6: The apparatus of example 1, wherein the switch is a power switch of a DC-DC converter.

Example 7: The apparatus of example 1 wherein the switch is coupled to an input power supply node, wherein the input power supply node is coupled to a capacitor of the switched capacitor circuitry when the input offset of the amplifier is being sensed, wherein the capacitor is coupled to the second input of the amplifier.

Example 8: The apparatus of example 7, wherein amplifier is powered by a power supply node different from the input power supply node, wherein the power supply node provides a voltage lower than a voltage provided by the input power supply node.

Example 9: The apparatus of example 7, wherein the first device is coupled to the capacitor when current is being sensed through the switch.

Example 10: The apparatus of example 1, wherein the DC level-shifter includes one of: diode-connected transistor or a transistor with a gate which is biased.

Example 11: The apparatus of example 1, wherein a loop gain of the amplifier is lower when current is being sensed through the switch than a loop gain during calibration of the input offset of the amplifier.

Example 12: The apparatus of example 1, wherein a Miller capacitance of the amplifier is increased during calibration of the input offset of the amplifier, and wherein the Miller capacitance of the amplifier is reduced when current is being sensed through the switch.

Example 13: An apparatus comprising: a power switch of a DC-DC converter; and a current sensor coupled to the power switch, wherein the current sensor comprises: an amplifier having a first input and a second input, and an output; and a switched capacitor circuitry coupled to the first input and the second input, the switched capacitor circuitry to sense an input offset of the amplifier, and to compensate the input offset during current measurement through a switch, wherein the power switch is coupled to an input power supply node, wherein the input power supply node is coupled to a capacitor of the switched capacitor circuitry when the input offset of the amplifier is being sensed, wherein the capacitor is coupled to the second input of the amplifier.

Example 14: The apparatus of example 13, wherein a loop gain of the amplifier is lower when current is being sensed through the switch than a loop gain during calibration of the input offset of the amplifier.

Example 15: The apparatus of example 13, wherein a Miller capacitance of the amplifier is increased during calibration of the input offset of the amplifier, and wherein the Miller capacitance of the amplifier is reduced when current is being sensed through the switch.

Example 16: The apparatus of example 13, wherein a common mode voltage is coupled to the first input when the input offset of the amplifier is being sensed.

Example 17: The apparatus of example 13 comprising: a first device which is a replica of the switch; a DC level-shifter coupled in series with the first device; a second device coupled in series with the DC level-shifter and controllable by the output of the amplifier; and a current mirror coupled to the second device.

Example 18: A system comprising: a memory; a processor coupled to the memory; a wireless interface to allow the processor to communicate with another device, wherein the processor includes a voltage regulator, wherein the processor includes a current sensor coupled to the voltage regulator, wherein the current sensor includes: an amplifier having a first input and a second input, and an output; and a switched capacitor circuitry coupled to the first input and the second input, the switched capacitor circuitry to sense an input offset of the amplifier, and to compensate the input offset during current measurement through a switch of the voltage regulator.

Example 19: The system of example 18, wherein the current sensor comprises: a first device which is a replica of the switch; a DC level-shifter coupled in series with the device; a second device coupled in series with the DC level-shifter and controllable by the output of the amplifier; and a current mirror coupled to the second device.

Example 20: The system of example 18, wherein a loop gain of the amplifier is lower when current is being sensed through the switch than a loop gain during calibration of the input offset of the amplifier.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   an amplifier having a first input, a second input, and an output;
   a switched capacitor circuitry coupled to the first input and the second input, the switched capacitor circuitry to sense an input offset of the amplifier, and to compensate the input offset during current measurement through a switch;
   a first device which is a replica of the switch;
   a direct current (DC) level-shifter coupled in series with the first device;
   a second device coupled in series with the DC level-shifter and controllable by the output of the amplifier; and
   a current mirror coupled to the second device.

2. The apparatus of claim 1, wherein the current mirror is operable to be turned off when the input offset of the amplifier is being sensed.

3. The apparatus of claim 1, wherein a common mode voltage is coupled to the first input when the input offset of the amplifier is being sensed.

4. The apparatus of claim 1, wherein the output of the amplifier is coupled to the second input when the input offset of the amplifier is being sensed.

5. The apparatus of claim 1, wherein the first device is smaller than the switch.

6. The apparatus of claim 1, wherein the switch is a power switch of a DC-DC converter.

7. The apparatus of claim 1 wherein the switch is coupled to an input power supply node, wherein the input power supply node is coupled to a capacitor of the switched capacitor circuitry when the input offset of the amplifier is being sensed, wherein the capacitor is coupled to the second input of the amplifier.

8. The apparatus of claim 7, wherein the amplifier is powered by a power supply node different from the input power supply node, wherein the power supply node provides a voltage lower than a voltage provided by the input power supply node.

9. The apparatus of claim 7, wherein the first device is coupled to the capacitor when current is being sensed through the switch.

10. The apparatus of claim 1, wherein the DC level-shifter includes one of: diode-connected transistor or a transistor with a gate which is biased.

11. The apparatus of claim 1, wherein a loop gain of the amplifier is lower when current is being sensed through the switch than during calibration of the input offset of the amplifier.

12. The apparatus of claim 1, wherein a Miller capacitance of the amplifier is increased during calibration of the input offset of the amplifier and reduced when current is being sensed through the switch.

13. An apparatus, comprising:
    a power switch of a voltage regulator;
    an input power supply node coupled to the power switch; and
    a current sensor coupled to the power switch, wherein the current sensor comprises:
      an amplifier having a first input, a second input, and an output; and
      a switched capacitor circuitry comprising a first capacitor coupled to the first input and a second capacitor coupled to the second input, wherein:
        the switched capacitor circuitry is to sense an input offset of the amplifier when current through the power switch is off, and to compensate the input offset during current measurement through the power switch; and
        the input power supply node is coupled to the first capacitor of the switched capacitor circuitry when the input offset of the amplifier is being sensed.

14. The apparatus of claim 13, wherein a loop gain of the amplifier is lower when current is being sensed through the power switch than during calibration of the input offset of the amplifier, when the current through the power switch is off.

15. The apparatus of claim 13, wherein a Miller capacitance of the amplifier is increased during calibration of the input offset of the amplifier when the current through the power switch is off, and reduced when current is being sensed through the power switch.

16. The apparatus of claim 13, wherein a common mode voltage is coupled to the first input when the input offset of the amplifier is being sensed.

17. The apparatus of claim 13 further comprising:
a first device which is a replica of the power switch;
a DC level-shifter coupled in series with the first device;
a second device coupled in series with the DC level-shifter and controllable by the output of the amplifier; and
a current mirror coupled to the second device.

18. A system, comprising:
a voltage regulator comprising a switch; and
a current sensor coupled to the voltage regulator, wherein the current sensor comprises:
an amplifier having a first input, a second input, and an output; and
a switched capacitor circuitry coupled to the first input and the second input, the switched capacitor circuitry to sense an input offset of the amplifier when current through the switch is off, and to compensate the input offset during current measurement through the switch of the voltage regulator; and
wherein a loop gain of the amplifier is lower when current is being sensed through the switch than during calibration of the input offset of the amplifier, when the current through the switch is off.

19. The system of claim 18, wherein the current sensor comprises:
a first device which is a replica of the switch;
a DC level-shifter coupled in series with the first device;
a second device coupled in series with the DC level-shifter and controllable by the output of the amplifier; and
a current mirror coupled to the second device.

* * * * *